United States Patent [19]

Proctor et al.

[11] Patent Number: 5,895,440
[45] Date of Patent: Apr. 20, 1999

[54] BATTERY MONITOR AND CYCLE STATUS INDICATOR

[75] Inventors: Richard L. Proctor; George A. Ure; Richard H. Young, Jr.; Steven H. Kahle; William L. Merkes, all of Seattle, Wash.

[73] Assignee: Cruising Equipment Company, Inc., Seattle, Wash.

[21] Appl. No.: 08/771,939

[22] Filed: Dec. 23, 1996

[51] Int. Cl.$^6$ .................... G01N 27/17; G01N 27/416
[52] U.S. Cl. .................... 702/63; 320/138; 320/152; 324/426; 324/433
[58] Field of Search .................... 364/481, 483; 340/636; 324/426–427, 430, 433, 431, 435, 428–429, 436, 481; 429/92–93; 320/161, 149, 138, 152, 106, 110, 156, 125, 160, 163, 132, 145, 131, 150, 116, 124, 164, 118, 120, 127, 162, 159; 702/63

[56] References Cited

U.S. PATENT DOCUMENTS

| | | | |
|---|---|---|---|
| 4,258,354 | 3/1981 | Carmon et al. | 340/309.4 |
| 4,338,596 | 7/1982 | Huber et al. | 340/636 |
| 4,388,582 | 6/1983 | Saar et al. | 320/156 |
| 4,617,506 | 10/1986 | Bogie et al. | 320/105 |
| 4,626,765 | 12/1986 | Tanaka | 320/127 |
| 5,075,620 | 12/1991 | Shaw | 324/122 |
| 5,130,659 | 7/1992 | Sloan | 324/435 |
| 5,136,620 | 8/1992 | Eaves | 377/15 |
| 5,159,272 | 10/1992 | Rao et al. | 324/429 |
| 5,216,371 | 6/1993 | Nagai | 324/428 |
| 5,284,719 | 2/1994 | Landau et al. | 429/50 |
| 5,295,078 | 3/1994 | Stitch et al. | 364/483 |
| 5,311,112 | 5/1994 | Creaco et al. | 320/125 |
| 5,315,287 | 5/1994 | Sol | 340/455 |
| 5,321,627 | 6/1994 | Reher | 364/483 |
| 5,325,041 | 6/1994 | Briggs | 320/149 |
| 5,339,017 | 8/1994 | Yang | 320/127 |
| 5,345,163 | 9/1994 | Gibbons et al. | 320/163 |
| 5,349,535 | 9/1994 | Gupta | 702/63 |
| 5,381,096 | 1/1995 | Hirzel | 324/427 |
| 5,459,671 | 10/1995 | Duley | 364/483 |
| 5,496,658 | 3/1996 | Hein et al. | 340/514 |
| 5,508,126 | 4/1996 | Braun | 320/150 |
| 5,508,599 | 4/1996 | Koenck | 320/138 |
| 5,508,600 | 4/1996 | Myslinski et al. | 340/636 |
| 5,521,443 | 5/1996 | Imura et al. | 340/825.76 |
| 5,608,304 | 3/1997 | Okumura | 320/134 |
| 5,633,573 | 5/1997 | Van Phuoc et al. | 320/128 |

OTHER PUBLICATIONS

"Cruising Equipmnent's E–Meter Our Best Buy Among Battery Monitors," *Powerboat Reports*, 9 (9): pp. 18–23 (Sep. 1996).
Anderson–Carbolon Group Brochure, "Anderson Power Products".
Anderson Power Products Brochure "Battery Data Recorder Brochure, The First Intelligent Cycle Recorder," Section 1.
C & D Charter Power System Brochure, "Introducing A Thinking Cap for Batteries," (1994).

*Primary Examiner*—James P. Trammell
*Assistant Examiner*—Cuong H. Nguyen
*Attorney, Agent, or Firm*—Christensen O'Connor Johnson & KindnessPLLC

[57] ABSTRACT

A battery monitor and cycle status indicator is disclosed. The battery monitor includes a voltage sensor capable of sensing the voltage between two nodes, for example, the positive and negative terminals of a battery. The voltage sensor is connected to an analog-to-digital converter which converts the analog voltage level sensed by the voltage sensor to a digital form. In turn, the analog-to-digital converter is coupled to a microprocessor. The microprocessor determines battery state-of-charge and historical values that relate to battery condition based upon the voltage levels provided by the analog-to-digital converter. The microprocessor is also coupled to a memory which stores battery history values computed by the microprocessor and program instructions for operation of the microprocessor. The battery monitor also includes a display that is capable of displaying battery state-of-charge and the historical values determined by the microprocessor. A switch is coupled to the microprocessor to inform the microprocessor to clear the history values presently stored in memory or to scroll the display from one battery parameter or history value to the next. The switch also enables the adjustment of the battery parameters that are stored in the memory to user-defined levels.

38 Claims, 3 Drawing Sheets

BATTERY MONITOR AND CYCLE STATUS INDICATOR

FIELD OF THE INVENTION

This invention relates to a battery monitoring system capable of recording key historical data.

BACKGROUND OF THE INVENTION

Batteries are commonly used in a wide array of applications and for a variety of vehicles such as boats, motor homes, fork lifts, and others. In most cases, the batteries used in such applications may be charged, discharged, and recharged again. In this manner, a single battery may serve as a source of electrical current for a significantly long period of time.

Although a battery may be charged and discharged many times, inefficient use of the battery can significantly shorten the battery's life. In general, a battery's service life is determined by the number of times a battery may be charged and discharged. One charge and discharge of a battery constitutes a single battery cycle. Thus, each battery has an expected lifetime that is limited to a given number of cycles. Improper battery cycling procedures can severely limit a battery's life. Perhaps most importantly, discharging the battery to extremely low voltages can damage the battery, reducing the battery's expected lifetime. Additional factors such as temperature, storage periods, discharge loads, and others may further reduce the battery's expected lifetime.

Without knowledge of battery state-of-charge and history such as the time since last charge, total number of cycles, time since last equalization, and total discharge time, battery users are generally unable to obtain efficient battery usage. Inevitably, batteries will be discharged to dangerously low levels, equalized at random times, and experience lifetimes many cycles shorter than that expected of an efficiently maintained battery.

Moreover, the lack of information about battery state-of-charge and history can result in wasted employee hours. Many industrial battery users for devices such as forklifts commonly remove the batteries from the devices to recharge them. Without information regarding the battery's current state-of-charge, battery-operated devices frequently discharge the battery to the point at which the battery is dead. In addition to discharging the battery to a harmfully low level, the battery often dies when the device is at an inconvenient location for removal and replacement of the battery. Furthermore, industrial batteries are often charged at a common charging station at which there may be dozens of batteries in various states of charge or discharge. In many such cases, there is no way to ascertain the number of cycles experienced by each battery, or whether a given battery has recently been discharged, charged, or equalized. As a result, a dead battery may be replaced by a battery having a less than optimal state-of-charge.

Worse yet, batteries may be discharged to a dangerously low level. When multi-cell series-connected batteries are discharged to a sufficiently low end voltage, it is possible for the poorest cell in the battery to be driven into voltage reversal. In some cases, this could result in cell venting or rupture.

In order to maximize battery life, and avoid the hazards associated with dangerous charge or discharge levels, it would be beneficial to have an inexpensive battery monitoring system that could be quickly and easily installed on a battery to provide "at-a-glance" status and key historical information about how the battery has been used.

Devices presently available to provide battery monitoring information are less than adequate. In some cases, batteries are manufactured with simple charge indicators. Generally, such indicators provide information related to the battery state-of-charge on a display that allows a battery user to determine whether the battery's charge is low, medium, or high. Even where such integrated battery monitors provide more detailed information regarding the battery's state-of-charge, they do not indicate other key historical information such as the number of cycles, lifetime discharge time, time since last charge, time since last equalization, and others.

Others have attempted to address this problem by providing a battery-mountable monitor capable of counting the number of charge cycles. For example, U.S. Pat. No. 5,136,620 to Eaves discloses a device which counts the number of charge cycles accumulated on a particular battery by sensing and counting each reversal of electrical current flow. Unfortunately, the device disclosed by Eaves is expensive and requires the installation of a specially configured inter-cell connector with an integral shunt and electronics. Moreover, the Eaves device is prone to registering erroneous cycle counts. This is likely to occur, for example, during the battery charging process. During the battery charging process, a charging system may charge to a particular voltage level and then cease charging. Once the discharge current reduces the battery's voltage to a sufficiently low level, the charger will begin charging again to return the battery to a fully charged level. Because the current will have been reversed, this trivial discharge and charge process will be counted by current-sensing devices such as the Eaves device as one charge cycle. In a worst case, the battery monitor could record many charge cycles during a single battery charging operation.

In addition to the less than ideal operation of the presently available battery monitoring devices, the devices that are presently available do not provide easy-to-read, "at-a-glance" displays. Presently, battery monitoring devices either provide little information, are difficult to read at a glance, or both.

Finally, other battery monitoring devices that are available and provide detailed information typically are not battery-mountable. In many cases, such devices are designed for use in conjunction with a battery charging system and are therefore intended to reside with the battery charger rather than the battery. While such devices may be capable of providing information about certain battery characteristics, and may even have a user-friendly display, they provide no information at the point at which they are most necessary—on the battery and the device to which it is connected.

The present invention is directed to providing a battery monitoring unit that overcomes the above-mentioned problems.

SUMMARY OF THE INVENTION

In accordance with this invention, a battery monitor and cycle status indicator is provided. The battery monitor includes a voltage sensor capable of sensing the voltage between two nodes, for example, positive and negative battery terminals. The voltage sensor is connected to an analog-to-digital converter which converts the analog voltage level sensed by the voltage sensor into a digital form. In turn, the analog-to-digital converter is coupled to a microprocessor. The microprocessor determines the battery state-of-charge (that is, the battery's voltage level condition) and battery historical information based upon the voltage levels provided by the analog-to-digital converter. The microprocessor is also coupled to a non-volatile memory, storing battery history in the non-volatile memory over time. The microprocessor is also connected to a switch which is used to command the microprocessor to clear the history presently stored in memory, to adjust variables used in the computational process, and to initiate the display of other derived historical data.

The microprocessor is also coupled to a display that is capable of displaying battery state-of-charge, history, and other characteristics. The display may include an LED display for displaying at-a-glance state-of-charge, and an LCD display for displaying battery history and other parameters.

In accordance with other aspects of this invention, a back light may be provided to provide lighting for the LCD display when necessary.

In accordance with further aspects of this invention, the microprocessor is capable of determining battery history, including the number of cycles experienced by the battery, the time since last charge, the present voltage level, the lifetime discharge duration, and the time since last equalization. Other characteristics such as the average voltage of the battery over the period of time in which monitoring has been in effect and the average lowest voltage (voltage prior to charging) can be stored in memory and displayed.

In accordance with still other aspects of this invention, the battery monitor's parameters may be altered to allow the computation of battery history to be adjusted for variations in temperature, battery type, charging systems, or other environmental conditions.

In accordance with other aspects of this invention, the display is capable of displaying the battery parameters and history calculated by the microprocessor, including the voltage level, the number of cycles experienced by the battery, the time since last charged, the present voltage level, the lifetime discharge duration, and the time since last equalization. In the currently preferred embodiments of the invention, the switch is used to scroll the display successively from one parameter or history value to another.

In accordance with yet other aspects of this invention, the display will allow a battery user to determine the battery's state-of-charge at a glance. Multi-state, or multi-colored, light-emitting diodes (LEDs) are provided to allow a battery user to quickly determine whether a battery is discharged, charged, or equalizing.

In accordance with yet further aspects of this invention, the battery monitor is battery-mountable. Thus, the battery monitor remains with a single battery to provide battery characteristic information at that battery's location.

In accordance with still other aspects of this invention, the battery monitor's housing is acid-proof to resist deterioration in the event that battery acid is inadvertently spilled on the battery monitor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
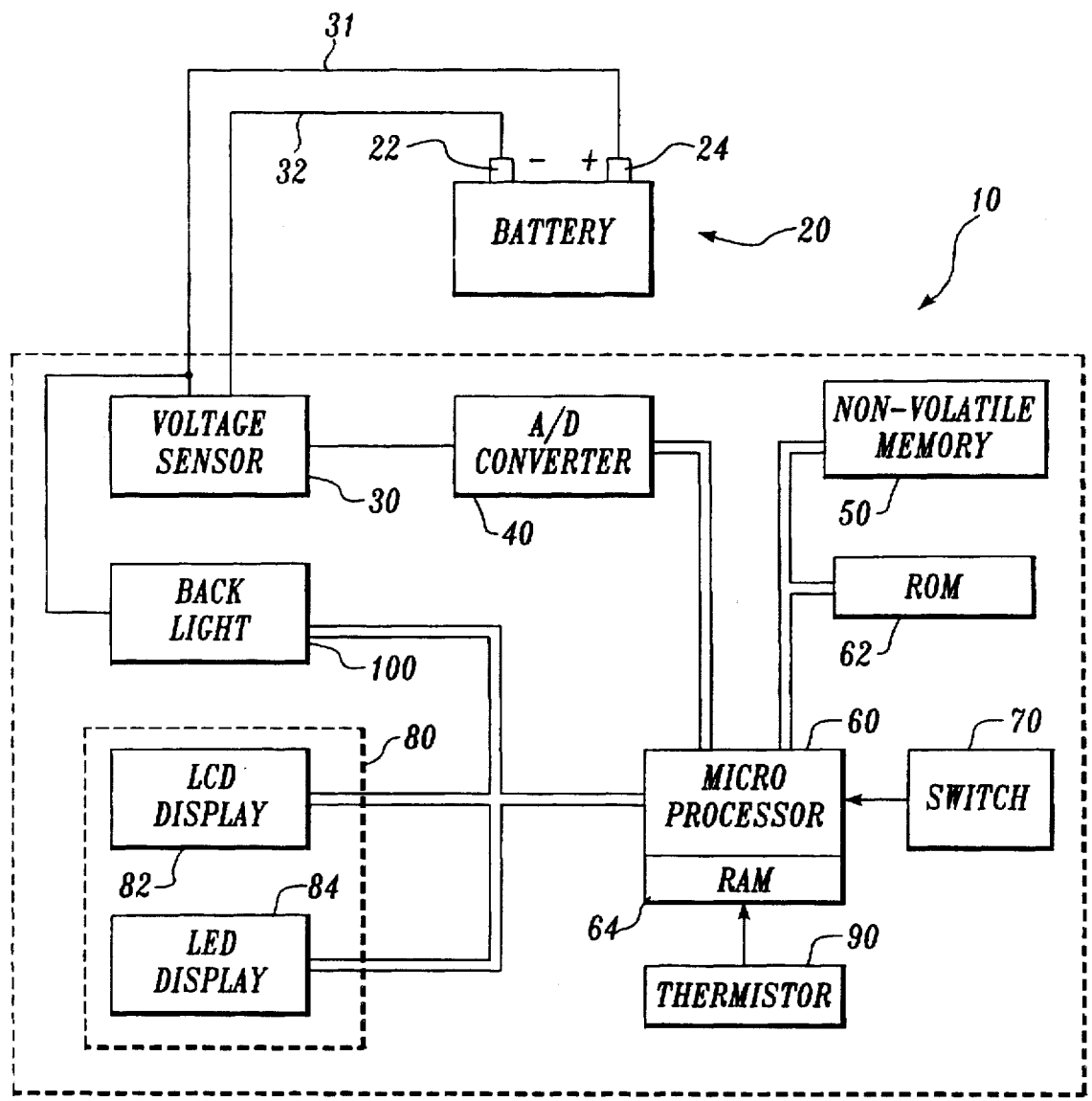
FIG. 1 is a block diagram of a battery monitor formed in accordance with this invention.

FIG. 1 is a block diagram of a battery monitor formed in accordance with this invention. The reference numeral 10 refers generally to a battery monitor formed in accordance with this invention. A typical 12-volt battery 20 having a negative terminal 22 and a positive terminal 24 is coupled to a voltage sensor 30. Those skilled in the art will recognize that batteries having voltages other than 12 volts (for example, 24 volts or 32 volts) may be used consistent with this invention. The voltage sensor 30 senses the analog voltage present across the negative terminal 22 and the positive terminal 24 of the battery 20.

The voltage sensor 30 is coupled to an analog-to-digital converter 40. In the preferred embodiment, the analog-to-digital converter 40 is a slow-conversion, integrating-style device that converts the analog voltage level sensed by the voltage sensor 30 to a digital representation. The analog-to-digital converter 40 currently preferred is a 14-bit device having a resolution of 0.005 volts and a range from 0 to 81.95 volts. Because it is a slow-conversion integrator, it reduces noise, eliminating the need for filters. Those skilled in the art will recognize that other analog-to-digital converters having a variety of resolutions, ranges, and conversion times may be used, consistent with the present invention.

The analog-to-digital converter 40 is also coupled to a microprocessor 60. The microprocessor 60 samples the digital voltage level present at the analog-to-digital converter 40 at the rate of approximately one sample per second. Those skilled in the art will recognize that other sampling rates sufficient to enable the microprocessor to determine battery state-of-charge and history may be used.

The microprocessor is also coupled to a memory which preferably includes a Read-Only-Memory (ROM) 62, a Random-Access-Memory (RAM) 64, and a non-volatile memory 50. The ROM 62 stores program instructions that control the microprocessor 60 so that the microprocessor 60 can determine battery state-of-charge and history. The RAM 62 is used by the microprocessor 60 to temporarily store information and data while determining the battery state-of-charge and history. In the preferred embodiment, the microprocessor determines battery history values including the number of cycles experienced by the battery, total discharge time, time since last charge, and time since last equalization. Numerous additional historical values may also be calculated, such as average low voltage, average discharge voltage, and lowest voltage level. The non-volatile memory 50 stores battery state-of-charge, history, and other parameters. Battery parameters include values such as threshold voltages and time values used to determine the battery state-of-charge and history. In the preferred embodiment, the non-volatile memory 50 is an electrically erasable programmable read-only memory (EEPROM). Those skilled in the art will recognize that other forms of non-volatile memory may also be used.

Each of the battery historical values determined by the microprocessor 60 is calculated as a function of the number of volts per battery cell. The battery monitor 10 is capable of providing key battery historical information for batteries having different voltages. When the battery monitor 10 is first installed on a fully charged battery, the microprocessor determines the nominal size of the battery in volts. From the nominal voltage size, the microprocessor 60 determines the number of cells in the battery so that voltage readings from the analog-to-digital converter 40 may be divided by the number of cells to determine the battery voltage per cell. For example, a fully charged 12-volt battery may have a charge of approximately 13.8 volts. From a reading of 13.8 volts, the microprocessor 60 will determine that a 12-volt battery having six cells is present, with each cell having a voltage of 2.3 volts. In a current embodiment of the invention, a single battery monitor 10 may be used for batteries having either 12, 24, 32, 36, or 48 volts. Those skilled in the art will recognize that other possible battery voltages and voltage combinations may be used, consistent with the present invention.

The microprocessor 60 uses the voltage level provided by the analog-to-digital converter 40 to determine the number of cycles experienced by the battery. Upon installation on a fresh battery, the cycle count is set to zero. The microprocessor then begins monitoring the battery to count cycles experienced, as a function of the battery voltage level. The microprocessor compares the present battery voltage with a predetermined fully-charged voltage level stored in the non-volatile memory 50. A typical 12-volt battery will contain 6 cells, each having a nominal voltage of 2.0 volts. In the preferred embodiment, the battery is assumed to be fully-charged when each cell has a voltage of 2.3 volts or greater. Once the sensed voltage level from the analog-to-digital converter 40 remains at or above the charged voltage level of 2.3 volts for 2.5 hours, the number of cycles experienced by the battery is incremented by one. The total number of cycles experienced by the battery is then stored in the non-volatile memory 50. After the cycle count has been incremented, the microprocessor 60 will not increment the cycle count again until the battery has been discharged. In current embodiments, a voltage level of less than 1.9 volts per cell for 10 minutes is assumed to indicate a discharged battery. After the battery meets this discharge level criterion, the microprocessor 60 will again begin monitoring for a fully charged level that will increment the cycle count. That is, the total number of cycles is incremented and stored in memory upon recharging the battery. As will be discussed further, the parameter values for the fully-charged voltage level and time, and the discharged voltage level and time, may be adjusted by a user.

The microprocessor 60 also determines lifetime battery discharge, or the total time the battery has been discharging. One of two alternative methods is used to compute the lifetime battery discharge time. In one embodiment, the microprocessor 60 begins counting as soon as the voltage on the battery 20 registered on the analog-to-digital converter 40 is below a voltage level of 2.15 volts per cell. The total time during which the battery is below 2.15 volts per cell is considered to be battery discharge time. In an alternative embodiment, the microprocessor 60 continually monitors the change in voltage level present at the analog-to-digital converter 40 during a given time period. The microprocessor 60 then computes the total discharge time as the total time during which the change in voltage level per time period is negative.

The elapsed time since the last charge is also computed by the microprocessor 60. In the preferred embodiment, the microprocessor 60 begins counting as soon as the voltage drops below 2.15 volts per cell and continues counting until the battery voltage goes back above that level.

The amount of time since the battery's last equalization is also calculated by the microprocessor 60. As is known in the art, equalization is an electrical reconditioning of the battery accomplished by completely recharging each battery cell into full gassing overcharge. In the operation of the invention, the non-volatile memory 50 stores a voltage level, which in the preferred embodiment is 2.5 volts per cell, that is indicative of battery equalization. Once the battery voltage has maintained the equalization voltage level for 2.5 hours, the battery will be determined to have been equalized. As soon as the battery voltage level falls below the equalization voltage level, the microprocessor will begin counting until the battery voltage level again reaches the equalization voltage level of 2.5 volts per cell. The total time counted will be the time since last equalization.

Each of these battery history values, for example, battery voltage, number of cycles experienced, lifetime discharge time, time since last charge, and time since last equalization, are stored in the non-volatile memory 50. As the microprocessor 60 calculates new battery history values, the values currently stored in the non-volatile memory 50 are replaced with the new values calculated by the microprocessor 60.

The microprocessor 60 is also coupled to a switch 70. By pressing and holding the switch 70 within 5 minutes of power-up, the switch 70 instructs the microprocessor 60 to clear the values for the battery history stored in the memory 50. This function is especially useful when removing a battery monitor from one battery and attaching it to another battery.

Figure 2:
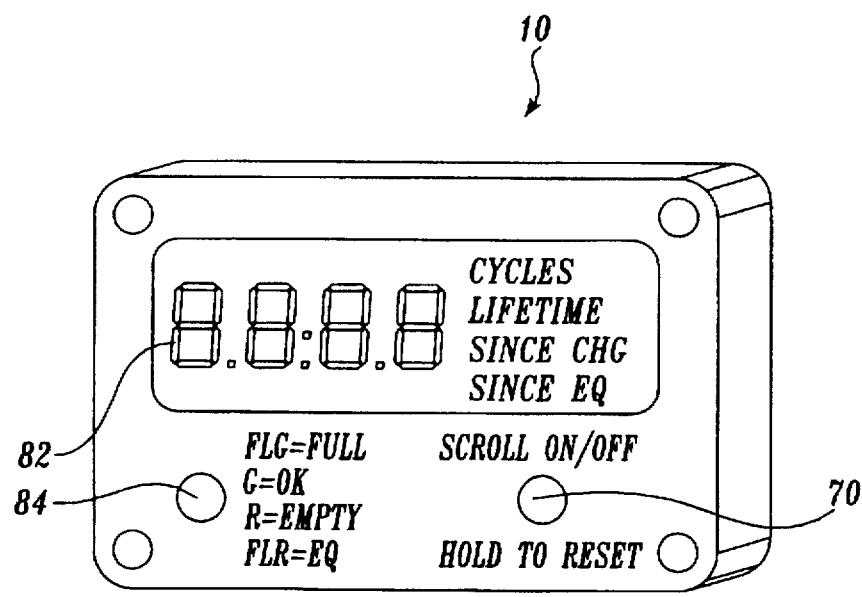
FIG. 2 is a perspective view of a battery monitor formed in accordance with this invention.

The microprocessor is also coupled to a display 80. In the preferred embodiment, the display 80 comprises a liquid crystal display (LCD) 82 and a light-emitting diode (LED) display 84. The LCD display 82 is capable of displaying each of the battery parameters and history values calculated by the microprocessor 60 and stored in the non-volatile memory 50. Thus, in a manner well-known in the art, the LCD display 82 forms a numerical display. The display 80 may be better understood with reference to FIG. 2. FIG. 2 shows a perspective view of a battery monitor formed in accordance with this invention. The LCD display 82, as shown in FIG. 2, contains liquid crystal segments arranged so that they are capable of forming numerical values between 00.00 and 9999. The switch 70 is shown below the LCD display 82 in FIG. 2. The switch 70 instructs the microprocessor 60 to display a different battery parameter or history value on the LCD display 82, thus serving in this fashion as a mode switch to "scroll" from one characteristic to another. In the preferred embodiment, each time the switch 70 is pressed, the microprocessor 60 instructs the display 82 to display the next battery parameter or history value, in sequence. Thus, repeated inputs from the switch 70 to the microprocessor 60 will instruct the microprocessor 60 to "scroll" the display from an indication of battery voltage, to number of cycles, to lifetime discharge, to time since last charge, to time since last equalization and back to battery voltage again. In this fashion, the LCD display 82 is capable of displaying any of the battery values calculated by the microprocessor 60 or stored in the non-volatile memory 50. Those skilled in the art will recognize that any order of parameters and history values may be used. Likewise, parameters and history values may be automatically, periodically scrolled without the use of a switch.

The display 80 also includes the LED display 84. In the preferred embodiment, the LED display 84 comprises a multi-state LED. A multi-state LED is a single LED package comprising two separate LEDs of different colors. The LEDs are joined together so that the single multi-state LED contains three leads with one common cathode. In the preferred embodiment, a multi-state LED capable of emitting red and green light is used. When properly energized in a manner well-known in the art, either of the red or green diodes may be illuminated so that either red or green light is emitted. Alternatively, both the red and green diodes may be energized at the same time, so that the red and green diodes combine to produce a yellow-orange light. The multi-state LED may also be energized using a pulse width modulated signal to produce other colors.

The single multi-state LED used for the LED display 84 used in the currently preferred embodiments produces a flashing green display when the microprocessor determines that the battery voltage has been above 2.30 volts for 2.5 hours, indicating that the battery is fully charged. A steady green display is provided when the battery voltage is between 2.03 and 2.37 volts per cell, indicating that the battery is acceptable for use. When the voltage is between 2.03 volts and 1.83 volts per cell, the multi-state LED displays a steady yellow, indicating that the voltage is low and the battery needs to be charged. The multi-state LED is a steady red color when the voltage level is less than 1.83 volts per cell, indicating that the battery charge is very low. Finally, the multi-state LED will be a flashing red color when the voltage level is greater than 2.5 volts per cell when the battery is being equalized. Those having skill in the art will recognize that other voltage threshold parameters and other colors or combinations may be used to indicate the above-described battery states-of-charge on the LED display. Likewise, the battery condition may be divided into a greater or lesser number of discrete states other than the five states-of-charge (i.e., fully charged, acceptable, low, very low, equalizing) used in the preferred embodiment.

Figure 3:
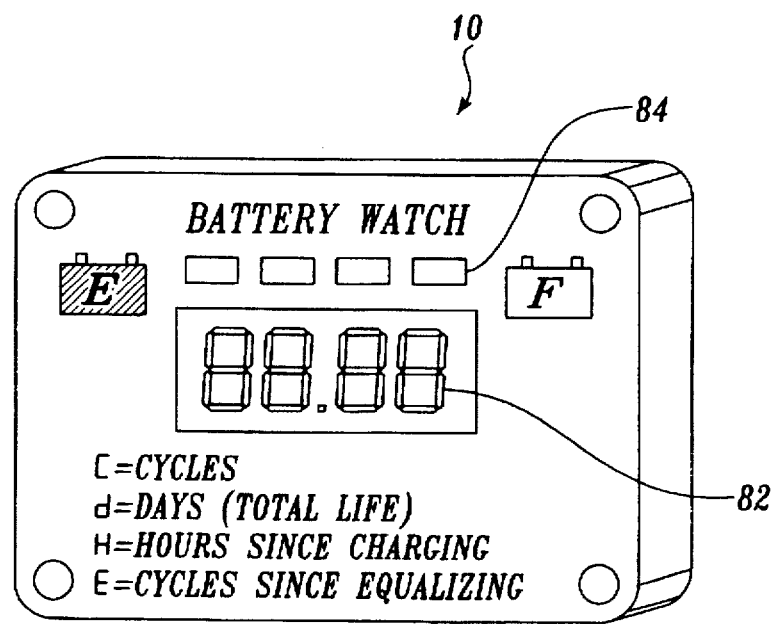
FIG. 3 is a perspective view of an alternative embodiment of a battery monitor formed in accordance with this invention.

Other LED displays 84 are also possible, consistent with the present invention. With reference to FIG. 3, an alternative embodiment is shown. In this embodiment, the LED display 84 comprises four separate LEDs arranged in a horizontal line. The two rightmost LEDs are single state LEDs that emit green light. The two leftmost LEDs are multi-state LEDs capable of emitting green, yellow, or red light. When the battery 20 is fully charged (above 2.3 volts per cell), all four LEDs in the LED display 84 emit green light, with the rightmost LED in a flashing green state. When the battery voltage is acceptable (between 2.15 volts per cell and 2.3 volts per cell), all four LEDs are a steady green. When the battery is at an acceptable voltage level (between 2.0 volts per cell and 2.14 volts per cell), the rightmost LED is not illuminated, while the three leftmost LEDs are a steady green. When the battery voltage is low (between 1.8 volts per cell and 1.99 volts per cell), the two rightmost LEDs are not illuminated while the two leftmost LEDs are a steady yellow. When the battery voltage is very low (less than 1.79 volts per cell), the three rightmost LEDs are not illuminated while the leftmost LED is a steady red. Finally, when the battery is equalizing (above 2.50 volts per cell), the three rightmost LEDs are not illuminated while the leftmost LED is a flashing red.

In addition to the functions discussed previously, the switch 70 enables a user to tune the parameters used by the microprocessor 60 in determining battery history. When the switch 70 is pressed and held for 5 seconds, the set-up mode is entered. When the set-up mode is entered, a first battery history value is displayed. If the switch 70 remains pressed, the LCD display 82 will scroll to display each history value, and each parameter value. If the switch 70 does not remain pressed, the LCD display 82 will successively display the next value at 7 second intervals. Once the last value has been displayed, the battery monitor 10 exits the set-up mode and returns to the normal display mode.

While in the set-up mode, the user may adjust the parameters used to determine battery history values. In the currently preferred embodiment, the history values are displayed first. After being displayed for 7 seconds, the next history value is displayed. After all history values have been displayed, the first parameter is displayed. If the switch 70 is depressed within 7 seconds after a parameter is displayed, the parameter value will increment until a maximum is reached, at which point it will roll over to a minimum value and then continue to increment. After 7 seconds without inputs from the switch 70, the displayed value will replace the value previously stored in the non-volatile memory 50 for the particular parameter. The LCD display 82 then displays the next parameter, which may be adjusted as with the first parameter. In this fashion, each of the parameters (e.g., fully charged battery cell voltage and time, low battery cell voltage and time, battery compensation for change in temperature, etc.) may be tuned by the user. After each parameter has been displayed, the battery monitor 10 reverts to the normal display mode. Those skilled in the art will recognize that the history values and parameter values may be displayed in any order, consistent with the present invention. Likewise, the amount of time before moving to the next value may be less than or greater than 7 seconds.

Preferably, the battery monitor 10 also adjusts the battery parameters for changes in temperature. The temperature at which a battery is discharged has a pronounced effect on the battery's service life and voltage characteristics. This is primarily due to a reduction in chemical activity and increased battery internal resistance at lower temperatures. Thus, in general, batteries will have increased capacity at higher temperatures. Depending on the type of battery (for example, whether it contains a wet or dry cell), the voltage level of a battery cell is reduced by 0.1 to 0.2 volts for every 10° F. decrease in temperature near 70° F. To compensate for this temperature sensitivity, the microprocessor 60 is coupled to a thermistor 90. The microprocessor 60 adjusts each of the voltage parameters (for example, the high battery voltage value, the low battery voltage value, and the equalization value) by reducing the parameter values by 0.15 volts for every 10° F. increase in temperature and increasing the threshold values by 0.15 volts for every 10° F. decrease in temperature. The value of 0.15 volts per 10° F. change in temperature may be adjusted in the tuning mode.

The battery monitor 10 may also include a back light 100. The back light 100 provides lighting for the LCD display 82 to enhance the visibility of the LCD display 82 when there is little or no external light. In the preferred embodiment, the back light 100 may be toggled on or off while in set-up mode. The back light status (on or off) is displayed as one of the many values that are scrolled and adjustable during the set-up mode. Those skilled in the art will recognize that a separate switch could also be employed to toggle the back light 100 on or off as desired.

Figure 4:
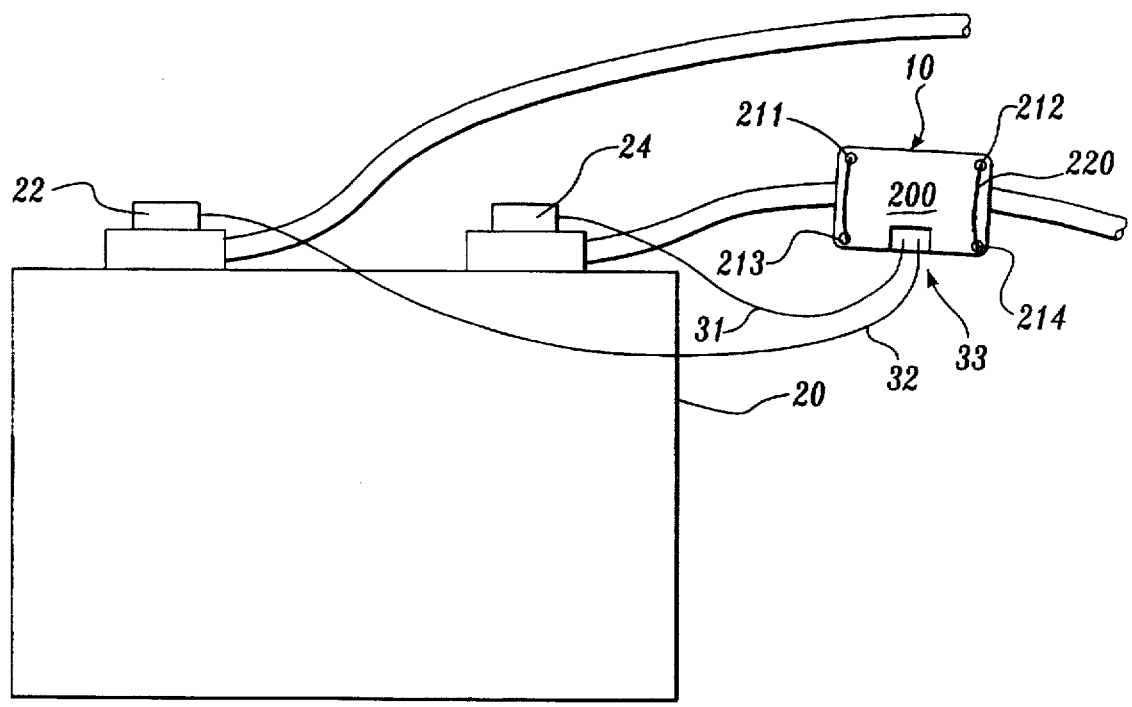
FIG. 4 is a perspective view of a battery monitor formed in accordance with this invention, shown mounted on a typical battery.

With reference to FIG. 4, the battery monitor 10 of the present invention is shown mounted on a typical 12-volt battery. The battery monitor 10 is encased in a housing 200 having a front and a back. The housing 200 includes four bores 211–214 passing from the front of the housing through to the back of the housing. The battery monitor 10 may then be fastened to the battery 20 by looping a tie 220 around a battery cable 26 and through one or more of the bores 211–214. In the preferred embodiment, the tie 220 is made of plastic. The tie 220 may also be, for example, a wire or rope material. Wires 31, 32 extend from a recess (not shown) in the back of the housing 200 to connect the voltage sensor 30 from the battery monitor 10 to the negative terminal 22 and positive terminal 24. The recess in the back of the housing 200 allows the wires 31, 32 to be accessible if the battery monitor 10 is alternatively mounted on a wall (e.g., a panel visible to the operator of a battery-powered forklift or other vehicle) or a surface of the battery.

Preferably, the battery monitor 10 is fully encased in an acid-proof housing, with the outer case of the currently preferred embodiments being constructed from a black plastic material. Once the battery monitor circuitry is positioned inside the plastic case, the entire case is filled with an optically-clear epoxy that completely surrounds the battery monitor circuitry. The resulting battery monitor is therefore impervious to environmental elements such as battery acid and salt water.

While the preferred embodiment of the invention has been illustrated and described, it will be apparent that various changes can be made therein without departing from the spirit and scope of the invention. For example, alternative analog-to-digital converters having either faster or slower conversion rates may be used in accordance with the present invention. Likewise, filters may be used in conjunction with the analog-to-digital converter to reduce the effects of noise. In addition, the voltage parameter values used to determine whether a battery is charged or discharged may differ from those employed in the preferred embodiment. Those skilled in the art will recognize that such values may be tailored to adapt to the particular battery and environmental conditions. Similarly, a display using alternate colors to represent a charged or discharged battery may be used consistent with the present invention. Accordingly, it is not intended that the scope of the invention be limited by the disclosure of the preferred embodiment. Instead, the invention should be determined entirely by reference to the claims that follow.

The embodiments of the invention in which an exclusive property or privilege is claimed are defined as follows:

1. A battery monitor for monitoring a battery to determine battery state-of-charge and battery history, comprising:
   means for sensing battery voltage level and providing a signal representative of the sensed voltage level; and
   means for processing the signal representative of the sensed voltage level and stored battery voltage values to determine battery history as a function of changes in the sensed battery voltage level compared to stored battery voltage values.

2. The battery monitor of claim 1, further comprising a means for processing the signal representative of the sensed voltage level to determine battery state-of-charge as a function of changes in the battery voltage level.

3. The battery monitor of claim 2, wherein the battery monitor is battery-mountable.

4. The battery monitor of claim 2, wherein the battery history comprises the number of cycles experienced by the battery.

5. The battery monitor of claim 2, wherein the battery history comprises time since last charge.

6. The battery monitor of claim 2, wherein the battery history comprises lifetime battery discharge time.

7. The battery monitor of claim 2, wherein the battery history comprises time since last equalization.

8. The battery monitor of claim 2, wherein the battery history comprises average discharge voltage.

9. The battery monitor of claim 2, wherein the battery history comprises lowest battery voltage.

10. The battery monitor of claim 2, wherein the battery history comprises average low voltage.

11. The battery monitor of claim 2, further comprising a display for displaying the battery state-of-charge, history, and battery parameters that relate to the monitoring of the battery.

12. The battery monitor of claim 11, wherein the display includes:
    a light emitting diode display for indicating the state-of-charge of the battery; and
    a liquid crystal display for displaying the battery history and battery parameters.

13. The battery monitor of claim 12, wherein the light emitting diode display comprises at least one multi-state light emitting diode for emitting light of different colors to represent different battery state-of-charge conditions.

14. The battery monitor of claim 11, further comprising memory means for storing the battery history and battery parameters.

15. The battery monitor of claim 14, wherein the parameter values may be adjusted by a user.

16. The battery monitor of claim 11, further comprising temperature sensing means for compensation of the battery parameters relative to changes in temperature conditions.

17. The battery monitor of claim 11, wherein the display includes a back light.

18. The battery monitor of claim 14, further comprising an acid-proof housing for containment and protection of the display, the memory means and the means for processing.

19. The battery monitor of claim 14, wherein the processing means is responsive to stored in the memory means for determining the battery characteristics for one of a plurality of batteries having different nominal voltages.

20. A battery monitor for determining and displaying battery history, comprising:
    a voltage sensor for sensing the battery voltage across positive and negative terminals of the battery;
    an analog-to-digital converter coupled to the voltage sensor for converting the voltage sensed by the voltage sensor to a digital representation of battery voltage;
    a microprocessor coupled to the analog-to-digital converter, the microprocessor operating responsive to stored program instructions and battery voltage parameter values for determining battery history data based upon changes in battery voltage, and supplying signals representative of the battery history data;
    a memory coupled to the microprocessor for storing the program instructions for operating the microprocessor, the parameter values for use by the microprocessor in determining the battery history data, and the battery history data; and
    a display coupled to the microprocessor for displaying battery history data.

21. The battery monitor of claim 20, wherein the microprocessor operates responsive to stored program instructions for determining battery state-of-charge.

22. The battery monitor of claim 21, wherein the battery monitor is battery-mountable.

23. The battery monitor of claim 21, wherein the battery history data includes the number of cycles experienced by the battery.

24. The battery monitor of claim 21, wherein the battery history data includes time since last charged.

25. The battery monitor of claim 21, wherein the battery history data includes lifetime battery discharge time.

26. The battery monitor of claim 21, wherein the battery history data includes time since last equalization.

27. The battery monitor of claim 21, wherein the battery history comprises average discharge voltage.

28. The battery monitor of claim 21, wherein the battery history comprises lowest battery voltage.

29. The battery monitor of claim 21, wherein the battery history comprises average low voltage.

30. The battery monitor of claim 21, wherein the display includes:

a light emitting diode display for indicating the state-of-charge of the battery; and a liquid crystal display for displaying the battery history data and the parameter values.

31. The battery monitor of claim 30, wherein the light emitting diode display includes at least one multi-state light emitting diode for emitting light of different colors to represent different battery state-of-charge conditions.

32. The battery monitor of claim 21, further comprising means for user initiated adjustment of the battery parameter values to provide selective adjustment of the determination of the battery history data.

33. The battery monitor of claim 21, further comprising a thermistor coupled to the microprocessor for enabling the microprocessor to adjust the battery parameter values for changes in temperature conditions.

34. The battery monitor of claim 21, further comprising a back light for providing light for the display.

35. The battery monitor of claim 21, further comprising an acid-proof housing for encasement of the analog-to-digital converter, the microprocessor, the memory and the display.

36. The battery monitor of claim 21, wherein the microprocessor is responsive to program instructions stored in the memory for determining the battery history for one of a plurality of batteries having different nominal voltages.

37. The battery monitor of claim 21, further comprising a switch coupled to the microprocessor for enabling a user to control the display of battery state-of-charge and battery history data.

38. The battery monitor of claim 37, wherein the microprocessor is responsive to program instructions stored in the memory and activation of the switch to alternatively scroll the battery history data and battery parameter values displayed on the display, clear the battery history data stored in the memory, and adjust the battery parameter values used by the microprocessor to determine the battery history.

* * * * *